United States Patent
Cho et al.

(10) Patent No.: US 12,022,689 B2
(45) Date of Patent: Jun. 25, 2024

(54) DISPLAY DEVICE

(71) Applicant: Samsung Display Co., Ltd., Yongin-Si (KR)

(72) Inventors: Seung Hwan Cho, Yongin-si (KR); Young Cheol Jeong, Hwaseong-si (KR); Jong Hyun Choi, Seoul (KR); Gyung Soon Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 393 days.

(21) Appl. No.: 17/605,595

(22) PCT Filed: Dec. 27, 2019

(86) PCT No.: PCT/KR2019/018656
§ 371 (c)(1),
(2) Date: Oct. 22, 2021

(87) PCT Pub. No.: WO2020/218705
PCT Pub. Date: Oct. 29, 2020

(65) Prior Publication Data
US 2022/0208898 A1    Jun. 30, 2022

(30) Foreign Application Priority Data

Apr. 23, 2019  (KR) .................... 10-2019-0047243

(51) Int. Cl.
*G09G 3/00*    (2006.01)
*H10K 59/12*   (2023.01)
(Continued)

(52) U.S. Cl.
CPC ........... *H10K 59/12* (2023.02); *H04M 1/0266* (2013.01); *H10K 77/111* (2023.02); *H10K 2102/311* (2023.02)

(58) Field of Classification Search
CPC ................ H10K 59/12; H10K 77/111; H10K 2102/311; H10K 59/87; H04M 1/0266;
(Continued)

(56) References Cited

U.S. PATENT DOCUMENTS 10,224,502 B2    3/2019  Cho et al.
10,638,619 B2    4/2020  Seo et al.
(Continued)

FOREIGN PATENT DOCUMENTS

CN    106560778 A    4/2017
CN    108183980 A    6/2018
(Continued)

OTHER PUBLICATIONS

Chinese Office Action corresponding to Application No. 201980095710.8, dated on Mar. 20, 2024, 7 pages.

*Primary Examiner* — Thuy N Pardo
(74) *Attorney, Agent, or Firm* — Innovation Counsel LLP

(57) ABSTRACT

A display device is provided. The display device comprises a display panel having a display region and a non-display region, wherein the display panel is bent along a first bending line extending in a first direction and a second bending line extending in a second direction crossing the first direction, an outer profile of the non-display region forms a corner portion of the display panel, and the corner portion is symmetrical with respect to an extension line that bisects an angle formed by the first bending line and the second bending line.

20 Claims, 12 Drawing Sheets

330a: 330a1, 330a2, , 330a3
330b: 330b1, 330b2, , 330b3

(51) Int. Cl.
*H04M 1/02* (2006.01)
*H10K 77/10* (2023.01)
*H10K 102/00* (2023.01)

(58) Field of Classification Search
CPC ............... H04M 1/0202; G02F 1/1333; G02F 1/133308; G02F 1/133331; G02F 2201/56
USPC .............................................. 345/30, 36, 83
See application file for complete search history.

(56) References Cited

U.S. PATENT DOCUMENTS

| | | | |
|---|---|---|---|
| 11,216,094 B2 | 1/2022 | Ahn et al. | |
| 11,599,152 B2 | 3/2023 | Sim et al. | |
| 2013/0242481 A1 | 9/2013 | Kim et al. | |
| 2017/0205923 A1 | 7/2017 | Shim et al. | |
| 2017/0374752 A1 | 12/2017 | Kim et al. | |
| 2018/0132371 A1* | 5/2018 | Yeum .................... | B32B 17/00 |
| 2018/0204895 A1 | 7/2018 | Lin et al. | |
| 2019/0103569 A1* | 4/2019 | Zhai .................... | H10K 50/844 |
| 2019/0239374 A1* | 8/2019 | Cha .................... | H04M 1/0266 |
| 2020/0301475 A1* | 9/2020 | Hirakata ............... | G06F 1/1652 |
| 2020/0396807 A1* | 12/2020 | Ikeda .................... | H10K 59/18 |
| 2021/0212229 A1* | 7/2021 | Yeum .................... | B32B 7/12 |
| 2023/0176802 A1* | 6/2023 | Yoshizumi ............. | G06F 3/147 345/1.3 |

FOREIGN PATENT DOCUMENTS

| | | |
|---|---|---|
| CN | 109147592 A | 1/2019 |
| CN | 109148512 A | 1/2019 |
| KR | 10-0578794 B1 | 5/2006 |
| KR | 10-2014-0018623 A | 2/2014 |
| KR | 10-2014-0092032 A | 7/2014 |
| KR | 10-2014-0115156 A | 9/2014 |
| KR | 10-2016-0097106 A | 8/2016 |
| KR | 10-2016-0149385 A | 12/2016 |
| KR | 10-2017-0071662 A | 6/2017 |
| KR | 10-2017-0085344 A | 7/2017 |
| KR | 10-2018-0065722 A | 6/2018 |
| KR | 10-2018-0125061 A | 11/2018 |
| KR | 10-1919803 B1 | 11/2018 |
| KR | 10-2018-0138252 A | 12/2018 |

\* cited by examiner

330a: 330a1, 330a2, , 330a3
330b: 330b1, 330b2, , 330b3

330a: 330a1, 330a2, , 330a3
330b: 330b1, 330b2, , 330b3

330a: 330a1, 330a2, , 330a3
330b: 330b1, 330b2, , 330b3

330a: 330a1, 330a2, , 330a3
330b: 330b1, 330b2, , 330b3

330a: 330a1, 330a2, , 330a3
330b: 330b1, 330b2, , 330b3

330a: 330a1, 330a2, , 330a3
330b: 330b1, 330b2, , 330b3

DISPLAY DEVICE

CROSS-REFERENCE TO RELATED APPLICATION

This application claims priority to Korean Patent Application No. 10-2019-0047243 filed on Apr. 23, 2019, and PCT Application No PCT/KR2019/018656, filed on Dec. 27, 2019, the entire contents of which are incorporated herein by reference.

BACKGROUND

1. Field of the Disclosure

The present inventive concept relates to a display device.

2. Description of the Related Art

Electronic devices such as a smartphone, a tablet PC, a digital camera, a laptop computer, a navigation device, and a smart television that provide an image to users include display devices for displaying the image. The display device includes a display panel that generates and displays an image and various input devices.

Among the display devices, an organic light-emitting display device (OLED) displays an image using an organic light-emitting element that generates light by recombination of electrons and holes. The OLED has a quick response time, a high brightness, and a wide viewing angle, and it can be driven with low power consumption.

Meanwhile, the display device generally displays an image only on a front portion, but recently, a display device that also displays an image on a side surface portion has been developed.

SUMMARY

The present inventive concept is directed to providing a display device capable of reducing a bezel region of a flat portion in a display device that displays an image even from a side surface portion.

The objects of the present inventive concept are not limited to the problems mentioned above, and other technical problems not mentioned above will be clearly understood by those skilled in the art from the following description.

A display device according to an embodiment for solving the above problems,

A display device according to another embodiment for solving the above problems, Specific matters of other embodiments are included in the detailed description and the drawings.

According to a display device according to an embodiment, in a display device that displays an image from a side surface portion as well, a bezel region of a flat portion may be reduced.

Effects according to the present inventive concept are not limited by the contents exemplified above, and more various effects are included in the present specification.

DETAILED DESCRIPTION OF THE EMBODIMENTS

Figure 1:
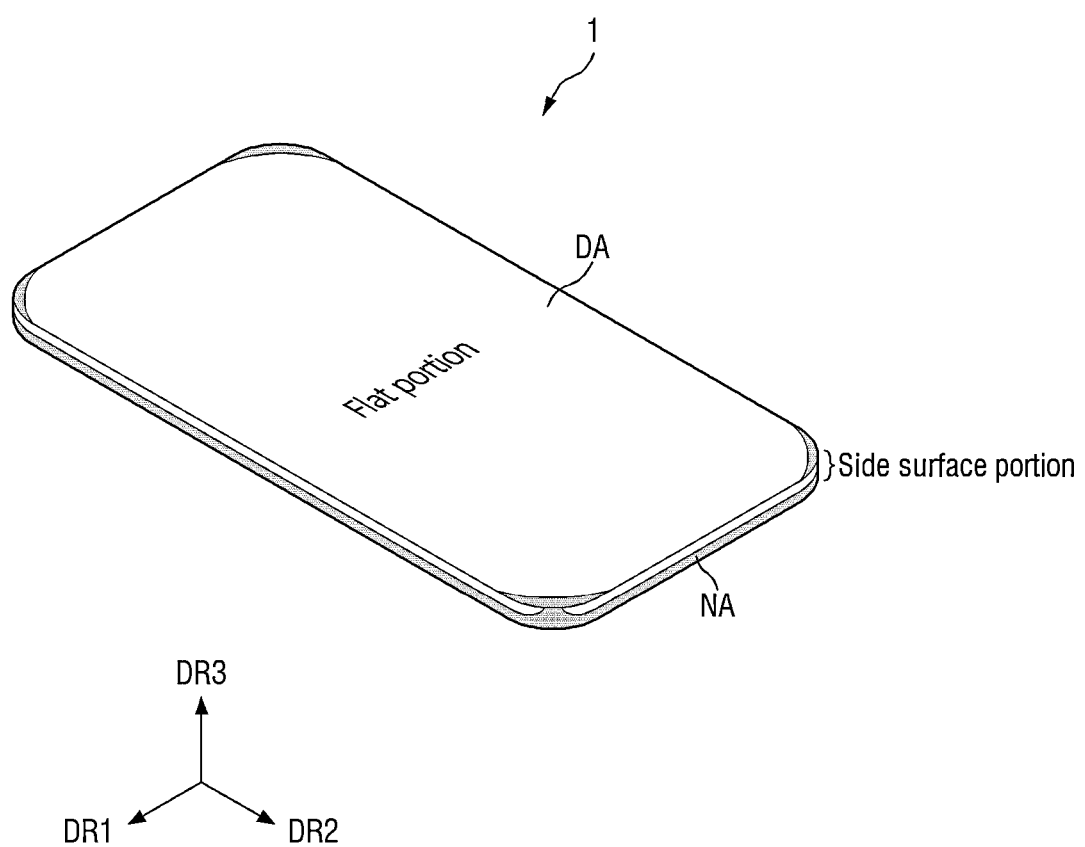
FIG. 1 is a perspective view of a display device according to an embodiment.
Figure 2:
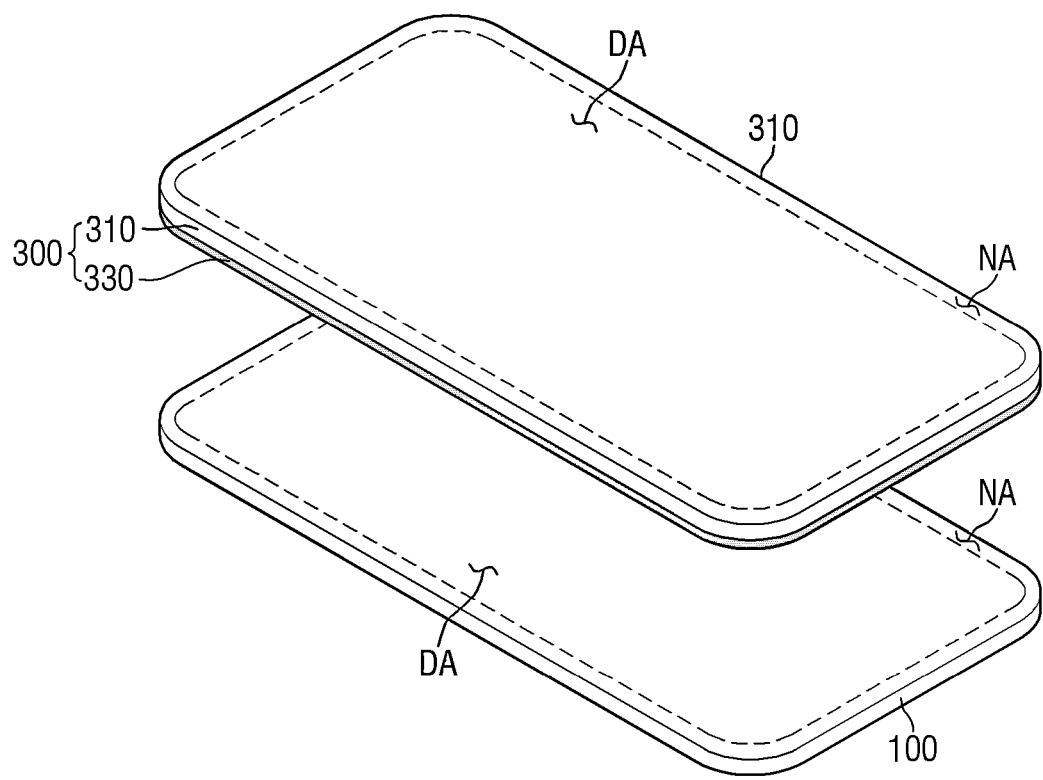
FIG. 2 is an exploded perspective view of the display device according to an embodiment.
Figure 3:
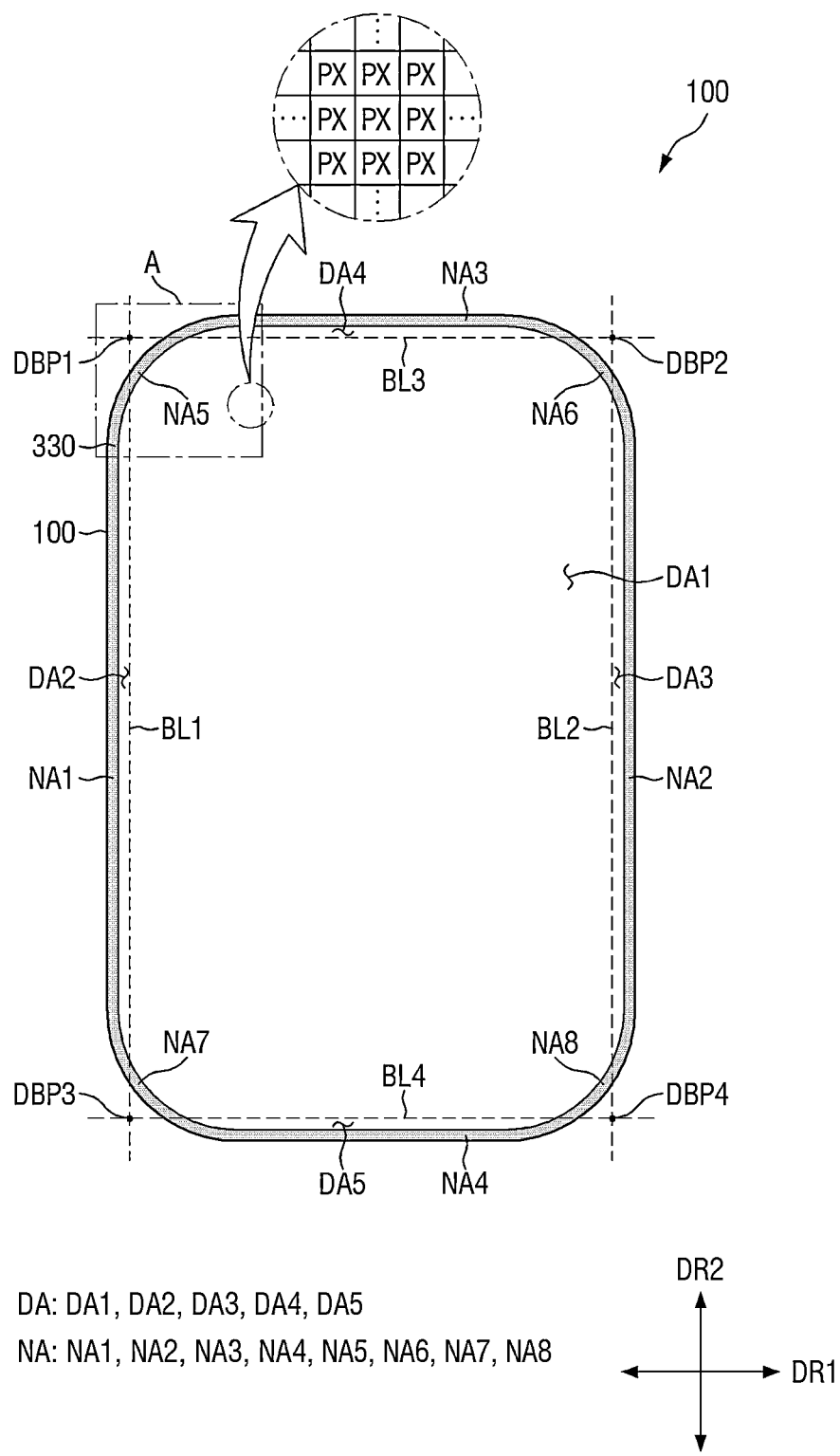
FIG. 3 is a plan layout view of a display panel according to an embodiment.
Figure 4:
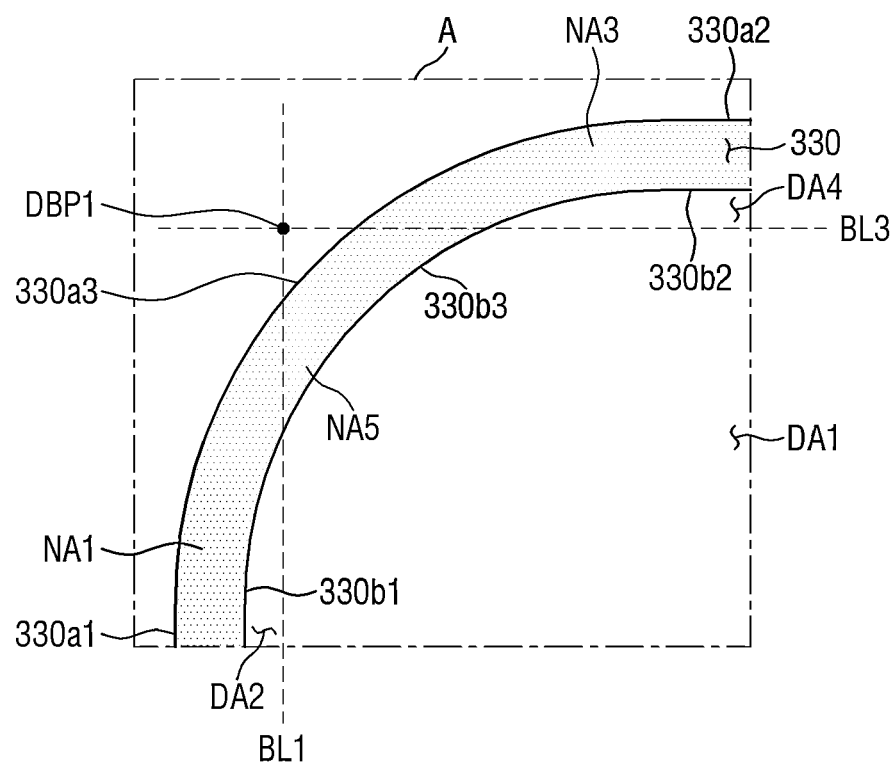
FIG. 4 is an enlarged view of region A of FIG. 3.
Figure 5:
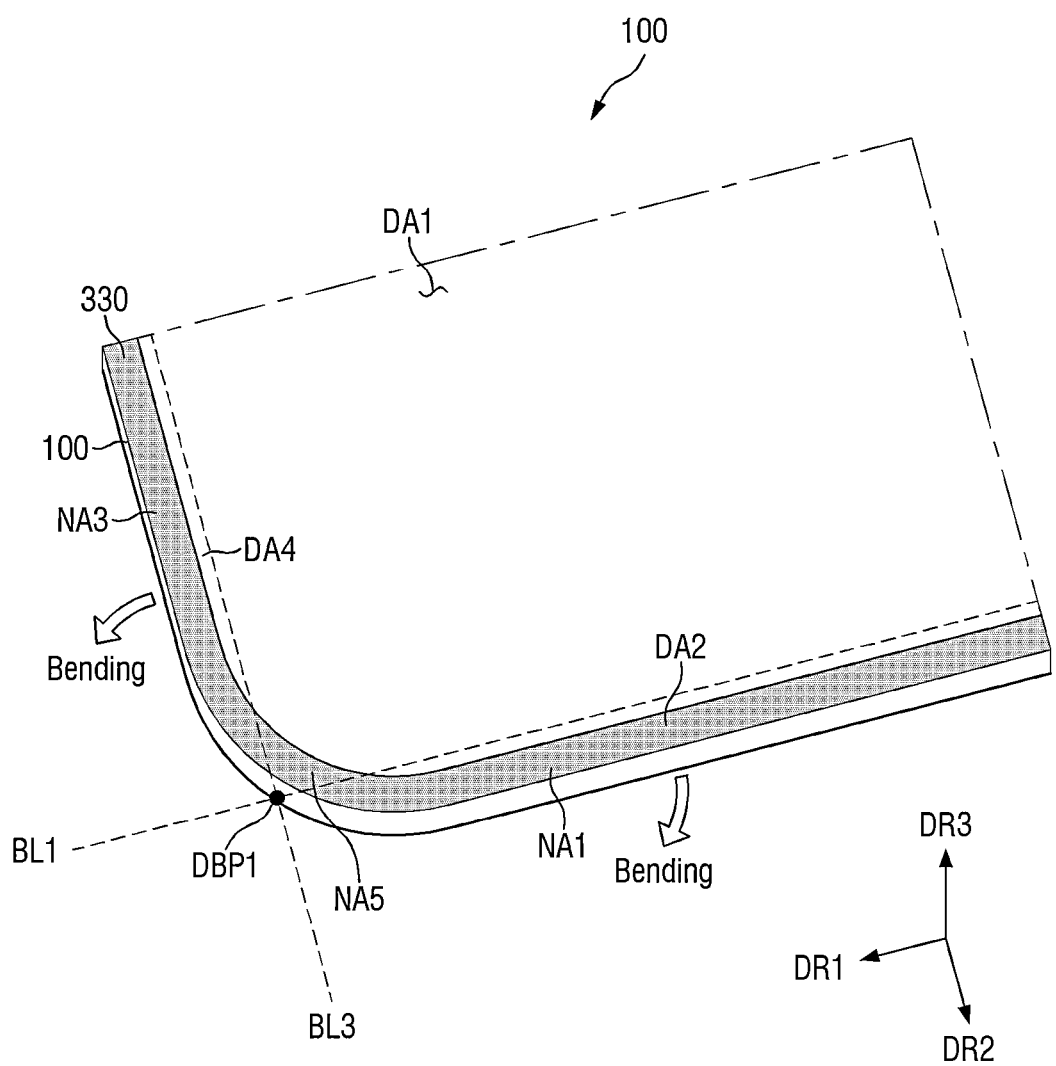
FIG. 5 is a plan view showing that the display panel according to an embodiment is bent.
Figure 6:
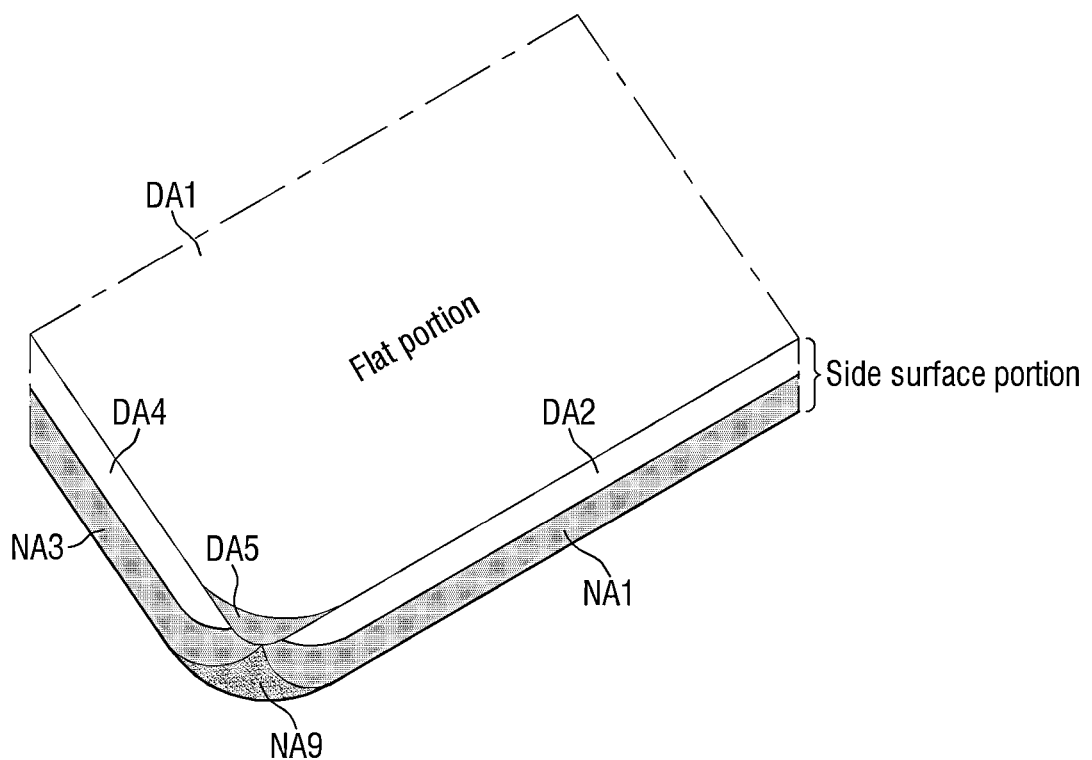
FIG. 6 is a perspective view of a display device bent according to FIG. 5.

FIG. 1 is a perspective view of a display device according to an embodiment, FIG. 2 is an exploded perspective view of the display device according to an embodiment, FIG. 3 is a plan layout view of a display panel according to an embodiment, FIG. 4 is an enlarged view of region A of FIG. 3, FIG. 5 is a plan view showing that the display panel according to an embodiment is bent, and FIG. 6 is a perspective view of a display device bent according to FIG. 5.

In embodiments, a first direction DR1 and a second direction DR2 indicate directions that intersect each other in different directions, for example, directions that intersect perpendicularly in a plan view. A third direction DR3 indicates a direction that intersects a plane on which the first direction DR1 and the second direction DR2 are placed, for example, a direction that intersects both the first direction DR1 and the second direction DR2 perpendicularly. In the exemplified drawings, the first direction DR1 indicates a horizontal direction of a display device 1, the second direction DR2 indicates a vertical direction of the display device 1, and the third direction DR3 indicates a thickness direction of the display device 1. In the following embodiments, one side in the first direction DR1 refers to a right direction in a plan view, the other side in the first direction DR1 refers to a left direction in a plan view, one side in the second direction DR2 refers to an upper direction in a plan view, the other side in the second direction DR2 refers to a lower direction in a plan view, one side in the third direction DR3 refers to an upper direction in a cross-sectional view, and the other side in the third direction DR3 refers to a lower direction in a cross-sectional view, respectively. However, the directions mentioned in the embodiments should be understood as referring to the relative directions, and the embodiments are not limited to the mentioned directions.

Referring to FIGS. 1 to 6, a display device 1 displays a moving image or a still image. A display direction of a main screen may be one side in the third direction DR3 (e.g., a top emission type display device), but may be the other side in the third direction DR3 (e.g., a bottom emission type display device), or may be both one side and the other side in the third direction DR3 (e.g., a double-sided emission type display device or a transparent display device).

The display device 1 may refer to any electronic device that provides a display screen. For example, the display device 1 may include a television, a laptop computer, a monitor, a billboard, an Internet of Things device, and the like as well as portable electronic devices such as a mobile phone, a smart phone, a tablet PC (personal computer), an electronic watch, a smart watch, a watch phone, a mobile communication terminal, an electronic organizer, an e-book reader, a portable multimedia player (PMP), a navigation device, a game console, a digital camera, and the like that provide display screens.

The display device 1 may include a display region DA that displays an image and a non-display region NA that is disposed around the display region DA and does not display the image. The non-display region NA may be a bezel region. The non-display region NA may overlap a printed layer 330 of a window 300 to be described later.

A planar shape of the display region DA may be a rectangle with rounded corners. A planar shape of the display region DA may be a rectangle having sides in the first direction DR1 that are longer than sides in the second direction DR2. However, the present inventive concept is not limited thereto, and the display region DA may have various shapes such as a rectangular shape in which sides in the second direction DR2 are longer than sides in the first direction DR1, a square shape, other polygonal shapes, a circular shape, and an elliptical shape.

The non-display region NA may be disposed around the display region DA. The non-display region NA may be disposed around both short sides and both long sides of the display region DA when the planar shape of the display region DA has the rectangular shape with rounded corners. That is, the non-display region NA may have a planar shape completely surrounding the display region DA in a plan view, for example, a rectangular frame shape with rounded corners.

Meanwhile, the display device 1 may include a flat portion disposed on one plane and a side surface portion disposed on a side surface of the flat portion. The side surface portion may be disposed on a different plane from the flat portion. The flat portion of the display device 1 may face one side in the third direction DR3, and the side surface portion may face a lateral direction intersecting a direction of the flat portion. When a planar shape of the display device 1 has a rounded rectangle, the display device 1 may include four side surface portions. Each of the side surface portions may be disposed on a different plane from the other side surface portions. Each of the side surface portions and the flat portion may form a right angle, but the present inventive concept is not limited thereto, and each of the side surface portions and the flat portion may form an acute angle or an obtuse angle.

The display region DA of the display device 1 may be mainly disposed on the flat portion and some of the display region DA may be disposed on the side surface portions, and the non-display region NA may be mainly disposed on the side surface portions of the display device 1 and some of the non-display region NA may be disposed on the flat portion. That is, the display region DA disposed on the side surface portions may be connected to the display region DA disposed on the flat portion at each side surface portion, and the non-display region NA disposed on the side surface portions may be disposed to be spaced apart from the display region DA disposed on the flat portion with the display region DA disposed on the side surface portions interposed therebetween. However, as shown in FIG. 1, the non-display region NA may be connected to the non-display region DA disposed on the flat portion in the side surface portion of a corner portion of the display device 1 in a plan view.

Referring to FIG. 2, the display device 1 may include a display panel 100 providing a display screen, and the window 300 disposed above the display panel 100 to cover and protect the display panel 100.

An organic light-emitting display panel, a micro-LED display panel, a nano LED display panel, a quantum dot light-emitting display panel, a liquid crystal display panel, a plasma display panel, a field emission display panel, an electrophoretic display panel, and an electrowetting display panel may be used as the display panel 100. Hereinafter, a case in which the organic light-emitting display panel is used as an example of the display panel 100 is exemplified, but the present inventive concept is not limited thereto, and when the same technical spirit is applicable, other display panels may also be used.

The display panel 100 may include a plurality of pixels. Each pixel PX may include a light-emitting layer and a circuit layer that controls an amount of light emitted from the light-emitting layer. The circuit layer may include a display line, a display electrode, and at least one transistor. The light-emitting layer may include an organic light-emitting material. The light-emitting layer may be sealed by an encapsulation film. The encapsulation film may seal the light-emitting layer to prevent moisture or the like from entering from the outside. The encapsulation film may be formed of a single or multi-layered inorganic film, or a stacked film in which inorganic films and organic films are alternately stacked.

The display panel 100 may include a flexible substrate including a flexible polymeric material such as polyimide. Accordingly, the display panel 100 is bendable, foldable, or rollable.

The window 300 may include a window base substrate 310 and a printed layer 330 disposed on the window base substrate 310.

The window base substrate 310 may be made of a transparent material. The window base substrate 310 may be made of, for example, glass or plastic. When the window base substrate 310 includes plastic, the window base substrate 310 may have a flexible property.

As an example of plastics applicable to the window base substrate 310, polyimide, polyacrylate, polymethylmethacrylate (PMMA), polycarbonate (PC), polyethylene naphthalate (PEN), polyvinylidene chloride, polyvinylidene difluoride (PVDF), polystyrene, an ethylene vinylalcohol copolymer, polyethersulphone (PES), polyetherimide (PEI), polyphenylene sulfide (PPS), polyarylate tri-acetyl cellulose (TAC), and cellulose acetate propionate (CAP) may be used. However, materials for the window base substrate 310 is not limited thereto. The plastic window may include one or more among the plastic materials listed above. When the window base substrate 310 includes plastic, the window base substrate 310 may further include a coating layer (not shown) disposed on upper and lower surfaces of the plastic. In an embodiment, the coating layer may be a hard coating layer including an organic layer that includes an acrylate compound and/or an organic-inorganic composite layer.

A planar shape of the window base substrate 310 corresponds to a shape of the display device 1. For example, when the display device 1 has a substantially rectangular shape in a plan view, the window base substrate 310 also has a substantially rectangular shape. As another example, when the display device 1 has a circular shape, the window base substrate 310 also has a circular shape.

Figure 8:
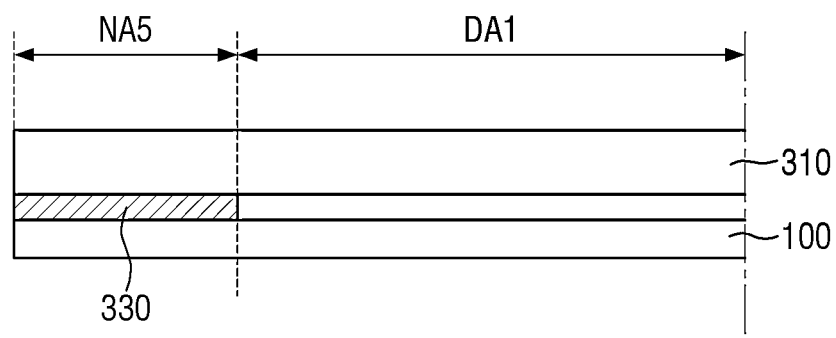
FIG. 8 is a cross-sectional view of the display panel and the window according to an embodiment.

FIG. 8 is a cross-sectional view of a display panel and a window according to an embodiment.

Referring to FIG. 8, the window base substrate 310 and the display panel 100 have the same planar shape in a plan view and may be disposed to overlap each other in the third direction DR3. In this case, like the display panel 100, the window base substrate 310 may include a flat portion and side surface portions disposed on a different plane from the flat portion. The flat portion of the window base substrate 310 may face the flat portion of the display panel 100, and the side surface portions of the window base substrate 310 may face the side surface portions of the display panel 100, respectively.

Figure 9:
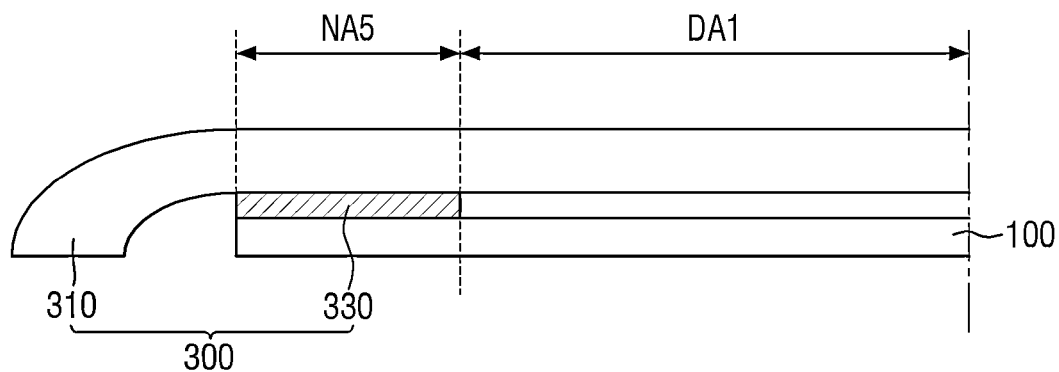
FIG. 9 is a cross-sectional view of a display panel and a window according to another embodiment.

FIG. 9 is a cross-sectional view of a display panel and a window according to another embodiment.

Referring to FIG. 9, a window base substrate 310 of a window 300a according to another embodiment may be larger than the display panel 100 in a plan view, and a side surface thereof may protrude from the side surface of the display panel 100. In this case, the window base substrate 310 may protrude outward from all sides (four sides in the drawing) of the display panel 100. Even in this case, like the display panel 100, the window base substrate 310 may include a flat portion and side surface portions disposed on a different plane from the flat portion. The flat portion of the window base substrate 310 may face the flat portion of the display panel 100 and the side surface portions of the window base substrate 310 may face the side surface portions of the display panel 100, respectively.

Referring again to FIGS. 2, 8 and 9, the printed layer 330 may be disposed on the window base substrate 310. The printed layer 330 may be disposed on one side and/or the other side of the window base substrate 310. The printed layer 330 may be disposed on an edge portion of the window base substrate 310 and may be disposed in the non-display region NA. The printed layer 330 may be a decorative layer and/or an outermost black matrix layer that imparts an aesthetic sense.

Another panel, such as a touch panel or an optical film such as a polarizing film, may be interposed between the display panel 100 and the window 300. Since various structures or manufacturing methods related thereto are widely known in the art, detailed descriptions will be omitted.

Referring to FIG. 3, the display panel 100 may include a plurality of pixels PX. The plurality of pixels PX may be arranged in a matrix form. A shape of each pixel PX may be a rectangular or square in a plan view, but the present inventive concept is not limited thereto, and the shape may also be a rhombic shape in which each side is inclined with respect to the first direction DR1. Each pixel PX may include a light-emitting region. Each light-emitting region may have the same shape as the pixel PX but may have different shapes from the pixel. For example, when the shape of the pixel PX is a rectangle, the shape of the light-emitting region of the corresponding pixel PX may be various shapes such as a rectangle, a rhombus, a hexagon, an octagon, and a circle.

The display panel 100 may have curved edges which are curved with respect to a plurality of bending lines BL1 to BL4 or may be bent in a vertical direction. A first bending line BL1 may be disposed adjacent to a first side of the display panel 100 and extend in the second direction DR2, a second bending line BL2 may be disposed adjacent to a second side of the display panel 100 that opposes the first side of the display panel and extend in the second direction DR2, a third bending line BL3 may be disposed adjacent to a third side of the display panel 100 and extend in the first direction DR1, and a fourth bending line BL4 may be disposed adjacent to a fourth side of the display panel 100 that opposes the third side of the display panel and extend in the first direction DR1. The first bending line BL1 and the second bending line BL2 may extend parallel to each other, and the third bending line BL3 and the fourth bending line BL4 may extend parallel to each other. Each of the first bending line BL1 and the second bending line BL2 may intersect the third bending line BL3 and the fourth bending line BL4. For example, the first bending line BL1 and the second bending line BL2 may extend perpendicular to the third bending line BL3 and the fourth bending line BL4, respectively, but the present inventive concept is not limited thereto.

The bending lines BL1 to BL4 may extend across both the display region DA and the non-display region NA of the display device 1. Thus, not only the non-display region NA but also at least a portion of the display region DA may be disposed on side surface portions of the display device 1.

The bending lines BL1 to BL4 form intersection points with other bending lines that cross each other. Bending intersection points DBP1 to DBP4 may be disposed outside of the display panel 100. For example, the first bending line BL1 and the third bending line BL3 may form a first bending intersection point DBP1 disposed outside of a corner portion at a upper left portion of the display panel 100, the second bending line BL2 and the third bending line BL3 may form a second bending intersection point DBP2 disposed outside of a corner portion a the upper right portion of the display panel 100, the first bending line BL1 and the fourth bending line BL4 may form a third bending intersection point DBP3 disposed outside of a corner portion at a lower left portion of the display panel 100, and the second bending line BL2 and the fourth bending line BL4 may form a fourth bending intersection point DBP4 disposed outside of a corner portion at a lower right portion of the display panel 100.

The bending intersection points DBP1 to DBP4 are disposed outside of the display panel 100, and thus it is possible to prevent double bending at the corner portions of the display panel 100 when the display panel 100 is bent along the bending lines BL1 to BL4. Accordingly, it is possible to prevent an increase in bending stress due to double bending in advance.

The display region DA and the non-display region NA may be divided into a plurality of regions with respect to the bending lines BL1 to BL4. The display region DA may include a first display region DA1 to a fifth display region DA5 divided by the bending lines BL1 to BL4, and the non-display region NA may include a first non-display region NA1 to an eighth non-display region NA8 divided by the bending lines BL1 to BL4.

The first display region DA1 may be surrounded by the bending lines BL1 to BL4 and may be disposed in a central portion of the display panel 100. The first display region DA1 may be disposed on a right side of the first bending line BL1, a left side of the second bending line BL2, a lower side of the third bending line BL3, and an upper side of the fourth bending line BL4. The second display region DA2 may be disposed on a left side of the first bending line BL1 and may be physically connected to the first display region DA1 with the first bending line BL1 as a boundary. The third display region DA3 may be disposed on a right side of the second bending line BL2 and may be physically connected to the first display region DA1 with the second bending line BL2 as a boundary. The fourth display region DA4 may be disposed on an upper side of the third bending line BL3 and may be physically connected to the first display region DA1 with the third bending line BL3 as a boundary. The fifth display region DA5 may be disposed on a lower side of the fourth bending line BL4 and may be physically connected to the first display region DA1 with the fourth bending line BL4 as a boundary.

The first non-display region NA1 may be disposed on a left side of the second display region DA2 and may be disposed to be spaced apart from the first display region DA1 with the second display region DA2 interposed therebetween, the second non-display region NA2 may be disposed on a right side of the third display region DA3 and may be disposed to be spaced apart from the first display region DA1 with the third display region DA3 interposed therebetween, the fourth non-display region NA4 may be disposed on an upper side of the fourth display region DA4 and may be disposed to be spaced apart from the first display region DA1 with the fourth display region DA4 interposed therebetween, and the fifth non-display region NA5 may be disposed on a lower side of the fifth display region DA5 and may be disposed to be spaced apart from the first display region DA1 with the fifth display region DA5 interposed therebetween.

The fifth non-display region NA5 may be disposed between the first non-display region NA1 and the third non-display region NA3 to physically connect the first non-display region NA1 and the third non-display region NA3 and may be disposed on the upper left corner of the display panel 100.

The sixth non-display region NA6 may be disposed between the second non-display region NA2 and the third non-display region NA3 to physically connect the second non-display region NA2 and the third non-display region NA3 and may be disposed on the upper right corner of the display panel 100.

The seventh non-display region NA7 may be disposed between the first non-display region NA1 and the fourth non-display region NA4 to physically connect the first non-display region NA1 and the fourth non-display region NA4 and may be disposed on the lower left corner of the display panel 100.

The eighth non-display region NA8 is disposed between the second non-display region NA2 and the fourth non-display region NA4 to physically connect the second non-display region NA2 and the fourth non-display region NA4 and is disposed on the lower right corner of the display panel 100.

Although not shown in the drawing, a pad region to which an external signal is input may be further disposed on a lower short side of the display panel 100. The pad region may be disposed on a region of the display panel 100 farther away from the display region DA than the non-display region NA disposed on the lower short side of the display panel 100. Signal lines extending from the display region DA are disposed in the pad region, and the signal lines may be electrically connected to an external signal terminal, for example, a lead line of a printed circuit board when a chip-on film is applied, or bumps of a driving chip when a chip-on plastic is applied. Other bending lines may be further disposed between the pad region and the fourth non-display region NA4. The other bending lines may extend in the first direction DR1. In a region defined by the other bending lines, inorganic insulating layers of the display panel 100 to be described later may be removed, and a via layer including an organic material may be disposed.

Referring to FIG. 4, the printed layer 330 of the window 300 is disposed to overlap the non-display regions of the display panel 100. In FIG. 4, for convenience of description, it will be described only the upper left corner portion of the display panel 100. A description to be described later may be applied, without change, to other corner portions of the display panel 100.

The printed layer 330 may include an outer profile 330a adjacent to an outer profile of the display panel 100 and an inner profile 330b adjacent to the display regions DA1, DA2, and DA4 of the display panel 100. The outer profile 330a may overlap the outer profile of the display panel 100 in the thickness direction, and the inner profile 330b may overlap boundaries between the display regions DA1, DA2, and DA4 and the non-display regions NA1, NA3, and NA5 in the thickness direction.

The outer profile 330a of the printed layer 330 may include a first-first portion 330a1 that overlaps an outer profile of the first non-display region NA1 and extends in the second direction DR2, a first-second portion 330a2 that overlaps an outer profile of the third non-display region NA3 and extends in the first direction DR1, and a first-third portion 330a3 that interconnects the first-first portion 330a1 and the first-second portion 330a2 and overlaps an outer profile of the fifth non-display region NA5.

The inner profile 330b of the printed layer 330 may include a second-first portion 330b1 that overlaps an inner profile of the first non-display region NA1 and extends in the second direction DR2, a second-second portion 330b2 that overlaps an inner profile of the third non-display region NA3 and extends in the first direction DR1, and a second-third portion 330b3 that interconnects the second-first portion 330b1 and the second-second portion 330b2 and overlaps an inner profile of the fifth non-display region NA5.

The first-first portion 330a1 and the second-first portion 330b1 of the printed layer 330 may each have a linear shape extending in the second direction DR2, and the first-second portion 330a2 and the second-second portion 330b2 may each have a linear shape extending in the first direction DR1.

On the other hand, the first-third portion 330a3 and the second-third portion 330b3 of the printed layer 330 may each have a partial curved surface shape having a predetermined curvature. The predetermined curvatures of the first-third portion 330a3 and the second-third portion 330b3 of the printed layer 330 may be different from each other, but the present inventive concept is not limited thereto and the same curvature may be applied thereto.

The first-third portion 330a3 and the second-third portion 330b3 of the printed layer 330 may each have one curvature, but the present inventive concept is not limited thereto, and the first-third portions 330a3 and the second-third portion 330b3 may each also have a plurality of curvatures.

Referring to FIGS. 5 and 6, in the display panel 100, edges of the display panel 100 may be bent or folded along the first bending line BL1 and the third bending line BL3. That is, the first non-display region NA1 and the second display region DA2 may be bent to the other side in the third direction DR3 along the first bending line BL1 to form the first side surface, and the third non-display region NA3 and the fourth display region DA4 may be bent to the other side in the third direction DR3 along the third bending line BL3 to form the third side surface. On the other hand, the fifth non-display region NA5 may form the flat portion of the display panel 100.

The display panel 100 may further include a ninth non-display region NA9 as shown in FIG. 6. The ninth non-display region NA9 may be a region in which the display panel 100 is not disposed when the display panel 100 is bent and may be a bezel region like the first to eighth non-display regions NA1 to NA8.

Figure 7:
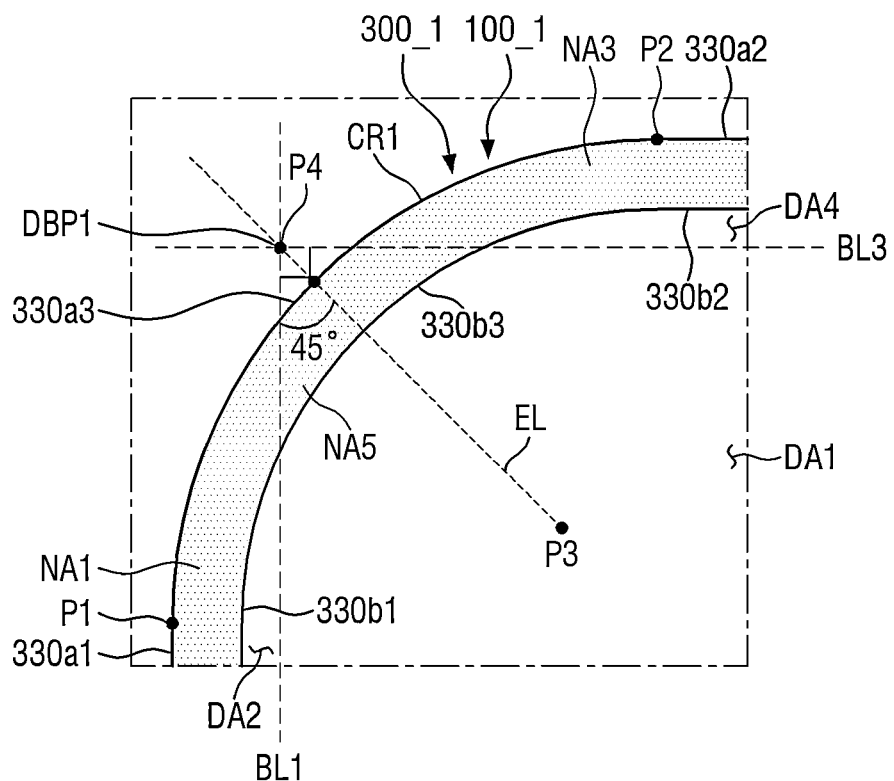
FIG. 7 is an enlarged partial plan view of a display panel and a window according to an embodiment.

FIG. 7 is an enlarged partial plan view of a display panel and a window according to an embodiment.

Referring to FIG. 7, the non-display regions of the display panel 100 may include outer and inner profiles aligned with and/or overlapping the outer profile 330a and the inner profile 330b of the printed layer 330 described above in the thickness direction.

That is, the first non-display region NA1, the third non-display region NA3, and the fifth non-display region NA5 may each have an outer profile aligned with the outer profile 330a of the printed layer 330, and the first non-display region NA1, the third non-display region NA3, and the fifth non-display region NA5 may each have an inner profile aligned with the outer profile 330a of the printed layer 330.

The outer profile of the first non-display region NA1 may include a first-fourth portion aligned with the first-first portion 330a1 and a first-fifth portion aligned with the first-third portion 330a3, the outer profile of the third non-display region NA3 may include a second-fifth portion aligned with the first-second portion 330a2 and a second-fifth portion aligned with the first-third portion 330a3, and the outer profile of the fifth non-display region NA5 may include a third-first portion aligned with the first-third portion 330a3.

The first-fourth portion may have a linear shape extending in the second direction DR2, the second-fourth portion may have a linear shape extending in the first direction DR1, and the first-fifth portion, the second-fifth portion, and the third-first portion may have a curved surface shape.

Meanwhile, the first-fourth portion and the first-fifth portion may include a first point P1 at which they meet each other and the second-fourth portion and the second-fifth portion may include a second point P2 at which they meet each other. A third point P3 may be disposed on an extension line EL bisection an angle formed between the first bending line BL1 and the third bending line BL3 in the first display region DA1. A fourth point P4 disposed on the third-first portion of the fifth non-display region NA5 and the first bending intersection point DBP1 may also be disposed on the extension line EL.

The upper left corner portion of the display panel 100 may be symmetrical with respect to the extension line EL. Specifically, the upper left corner portion of the display panel 100 may include the first-fifth portion of the first non-display region NA1, the second-fifth portion of the third non-display region NA3, and the third-first portion of the fifth non-display region NA5.

With respect to the extension line EL, the first-fifth portion of the first non-display region NA1 and the second-fifth portion of the third non-display region NA3 may be symmetrical to each other, and the third-first portion of the fifth non-display region NA5 on one side of the extension line EL and the third-first portion of the fifth non-display region NA5 on the other side of the extension line EL may also be symmetrical. In the present specification, the term "symmetrical" refers to a case in which, when folding a configuration of one side of the extension line EL and a configuration of the other side of the extension line EL with respect to the extension line EL, the configurations completely overlap or substantially overlap each other.

That is, along the outer profiles of the non-display regions NA1, NA3, and NA5 of the upper left corner portion of the display panel 100_1, a length from the first point P1 to the fourth point P4 may be the same as a length from the second point P2 to the fourth point P4.

In addition, when a curved surface shape between the first point P1 and the fourth point P4 formed along the outer profiles of the non-display regions NA1, NA3, and NA5 of the upper left corner portion of the display panel 100 has a predetermined curvature, and a curved surface shape between the second point P2 and the fourth point P4 formed along the outer profiles of the non-display regions NA1, NA3, and NA5 of the upper left corner portion of the display panel 100_1 has a predetermined curvature, the curved surface shape between the first point P1 and the fourth point P4 and the curved surface shape between the second point P2 and the fourth point P4 may each have a first curvature CR1.

A center point of a circle when the circle is drawn by the curved surface shape between the first point P1 and the fourth point P4 and a center point of a circle when the circle is drawn by the curved surface shape between the second point P2 and the fourth point P4 may be the same as each other.

The window base substrate 310 may have the same or substantially similar planar shape to the display panel 100 as described above and may be disposed to overlap the display panel 100 in the thickness direction.

That is, the window base substrate 310 may include an outer profile aligned with and/or overlapping the outer profile of the display panel 100. The outer profile of the window base substrate 310 may be completely aligned with the outer profile of corner portions of the display panel 100.

With respect to the extension line EL, a portion aligned with the first-fifth portion of the first non-display region NA1 among outer profiles of the window base substrate 310 and a portion aligned with the second-fifth portion of the third non-display region NA3 among the outer profiles of the window base substrate 310 may be symmetrical, and a portion aligned with the third-first portion of the fifth non-display region NA5 on one side of the extension line EL and the third-first portion of the fifth non-display region NA5 on the other side of the extension line EL among the outer profiles of the window base substrate 310 may also be symmetrical.

An upper left corner portion of the window base substrate 310 may have one curvature. One curvature of the upper left corner portion of the window base substrate 310 may be equal to the curvature of the upper left corner portion of the display panel 100. One curvature of the window base substrate 310 may be the first curvature CR1.

In the display panel 100 of the display device 1 according to an embodiment, as described above, the bending intersection points DBP1 to DBP4 are disposed outside of the display panel 100, and thus it is possible to prevent double bending at the corner portions of the display panel 100 by the intersecting bending lines BL1 to BL4 when the display panel 100 is bent along the bending lines BL1 to BL4. Accordingly, it is possible to prevent an increase in bending stress due to double bending in advance.

In addition, in the display panel 100 according to an embodiment, the upper left corner portion of the display panel 100 are symmetrically formed with respect to the extension line EL, and accordingly, when the outer profiles of the non-display regions that are disposed at the upper left corner portion and constitute the side surface portions of the display panel 100, for example, the first and third non-display regions NA1 and NA3 and the fifth non-display region NA5 constituting the flat portion of the display panel 100 are formed by a cutting process or the like, the outer profiles of the non-display regions may be formed with the same curvature and the same length with respect to the extension line EL, thereby greatly reducing the process time and process error.

Further, in a case in which the window base substrate 310 according to FIG. 9 is larger than the display panel 100 in a plan view and the window 300a whose side surface protrudes from the side surface of the display panel 100 is used, when the upper left corner portion of the display panel 100 has an asymmetric shape with respect to the extension line EL, the window base substrate 310 of the window 300a covering the upper left corner portion of the display panel 100 may also have different curvatures and areas with respect to the extension line EL. However, in the display panel 100 according to an embodiment, since the upper left corner portion of the display panel 100 are symmetrically formed with respect to the extension line EL, the window base substrate 310 of the corresponding window 300a may also have the same curvature and area with respect to the extension line EL. Accordingly, during a lamination process of the window 300a and the display panel 100, a bonding failure due to lamination pressure or the like may be prevented in advance.

Configurations of the upper right corner portion, the lower left corner portion and the lower right corner portion may be substantially the same as the configuration of the upper left corner portion described hereinabove.

Hereinafter, other embodiments will be described. In the following embodiments, the same components as those of the previously described embodiments are referred to by the same reference numerals, and descriptions thereof will be omitted or simplified.

Figure 10:
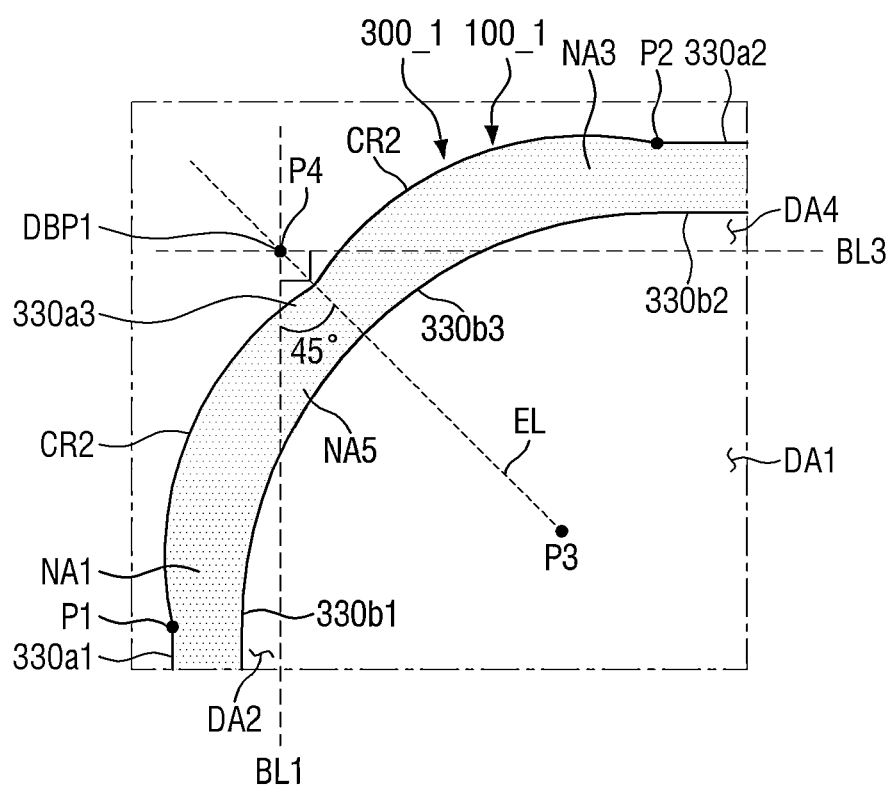
FIG. 10 is an enlarged partial plan view of a display panel and a window according to another embodiment.

FIG. 10 is an enlarged partial plan view of a display panel and a window according to another embodiment. Referring to FIG. 10, a display panel 100_1 according to the present embodiment is different from the display panel 100 according to FIG. 7 in that an inflection point is included on outer profiles of non-display regions at a fourth point P4.

More specifically, in the display panel 100_1 according to the present embodiment, the inflection point may be formed at the fourth point P4 where the extension line EL intersects the third-first portion.

As in an embodiment, the upper left corner portion of the display panel 100_1 may be symmetrical with respect to the extension line EL. With respect to the extension line EL, the first-fifth portion of the first non-display region NA1 and the second-fifth portion of the third non-display region NA3 may be symmetrical to each other, and the third-first portion of the fifth non-display region NA5 on one side of the extension line EL and on the other side of the extension line EL may be symmetrical.

The inflection point may be disposed in the third-first portion of the fifth non-display region NA5. Even in the present embodiment, along the outer profiles of the non-display regions NA1, NA3, and NA5 of the upper left corner portion of the display panel 100_1, a length from the first point P1 to the fourth point P4 may be the same as a length from the second point P2 to the fourth point P4.

In addition, when a curved surface shape between the first point P1 and the fourth point P4 formed along the outer profiles of the non-display regions NA1, NA3, and NA5 of the upper left corner portion of the display panel 100 has a predetermined curvature, and a curved surface shape between the second point P2 and the fourth point P4 formed along the outer profiles of the non-display regions NA1, NA3, and NA5 of the upper left corner portion of the display panel 100_1 has a predetermined curvature, the curved surface shape between the first point P1 and the fourth point P4 and the curved surface shape between the second point P2 and the fourth point P4 may have the same curvature. That is, the curved surface shape between the first point P1 and the fourth point P4 and the curved surface shape between the second point P2 and the fourth point P4 may each have a second curvature CR2.

However, unlike the display panel 100 of FIG. 7, in the display panel 100_1 according to the present embodiment, a center point of a circle when the circle is drawn by the curved surface shape between the first point P1 and the fourth point P4 and a center point of a circle when the circle is drawn by the curved surface shape between the second point P2 and the fourth point P4 may be different from each other.

A window base substrate 310_1 may have the same or substantially similar planar shape to the display panel 100_1 as described above and may be disposed to overlap the display panel 100_1 in the thickness direction.

That is, the window base substrate 310_1 may include an outer profile aligned with and/or overlapping the outer profile of the display panel 100_1. The outer profile of the window base substrate 310_1 may be completely aligned with the outer profile of the upper left corner portion of the display panel 100.

Even in the present embodiment, as described above, the bending intersection points DBP1 to DBP4 are disposed outside of the display panel 100_1, and thus it is possible to prevent double bending at the corner portions of the display panel 100_1 when the display panel 100_1 is bent along the bending lines BL1 to BL4. Accordingly, it is possible to prevent an increase in bending stress due to double bending in advance.

In addition, in the display panel 100_1 according to the present embodiment, the upper left corner portion of the display panel 100_1 are symmetrically formed with respect to the extension line EL, and accordingly, when the outer profiles of the non-display regions that are disposed at the upper left corner portion and constitute side surface portions of the display panel 100_1, for example, the first and third non-display regions NA1 and NA3 and the fifth non-display region NA5 constituting a flat portion of the display panel 100, are formed by a cutting process or the like, the outer profiles of the non-display regions may be formed with the same curvature and the same length with respect to the extension line EL, thereby greatly reducing the process time and process error.

Configurations of the upper right corner portion, the lower left corner portion and the lower right corner portion may be substantially the same as the configuration of the upper left corner portion described hereinabove.

Figure 11:
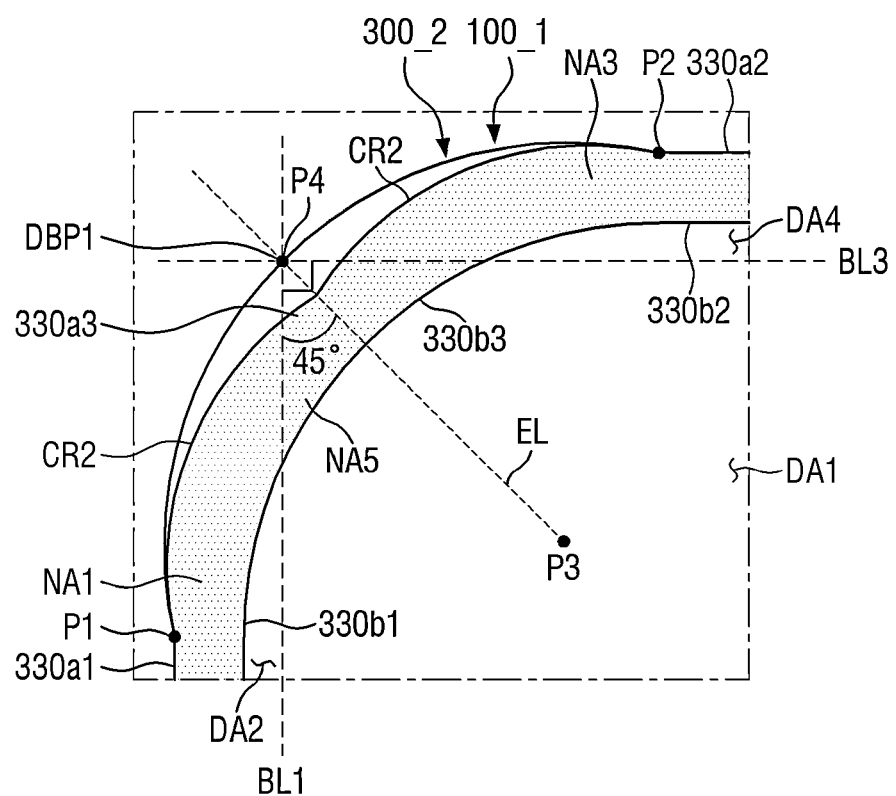
FIG. 11 is an enlarged partial plan view of a display panel and a window according to still another embodiment.

FIG. 11 is an enlarged partial plan view of a display panel and a window according to still another embodiment.

Referring to FIG. 11, a window 300_2 according to the present embodiment is different from the window 300_1 according to FIG. 10 in that the window 300_2 protrudes more than a corner portion of a display panel 100_1 in a plan view.

More specifically, in the window 300_2 according to the present embodiment, a window base substrate may protrude more than the upper left corner portion of the display panel 100_1 in a plan view. For example, as shown in FIG. 11, the window 300_2 may protrude more than the corner portion of the display panel 100_1 in a plan view.

The window base substrate of the window 300_2 may have a corner portion that passes through the first point P1 and the second point P2 of the display panel 100_1 in a plan view and extends outward more than the fourth point P4. A curvature of the corner portion of the window base substrate of the window 300_2 may be greater than the curvature of the upper left corner portion of the display panel 100_1.

The number of curvatures of the corner portion of the window base substrate of the window 300_2 may be one, but the present inventive concept is not limited thereto, and a plurality of curvatures may be included. Even in this case, the curvature of the upper left corner portion may be greater than the curvature of the upper left corner portion of the display panel 100_1.

Even in the present embodiment, as described above, the bending intersection points DBP1 to DBP4 are disposed outside of the display panel 100_1, and thus it is possible to prevent double bending at the corner portions of the display panel 100_1 when the display panel 100_1 is bent along the bending lines BL1 to BL4. Accordingly, it is possible to prevent an increase in bending stress due to double bending in advance.

In addition, in the display panel 100_1 according to the present embodiment, the upper left corner portion of the display panel 100_1 are symmetrically formed with respect to the extension line EL, and accordingly, when the outer profiles of the non-display regions that are disposed at the corner portion and constitute side surface portions of the display panel 100_1, for example, the first and third non-display regions NA1 and NA3 and the fifth non-display region NA5 constituting a flat portion of the display panel 100, are formed by a cutting process or the like, the outer profiles of the non-display regions may be formed with the same curvature and the same length with respect to the extension line EL, thereby greatly reducing the process time and process error.

Configurations of the upper right corner portion, the lower left corner portion and the lower right corner portion may be substantially the same as the configuration of the upper left corner portion described hereinabove.

Figure 12:
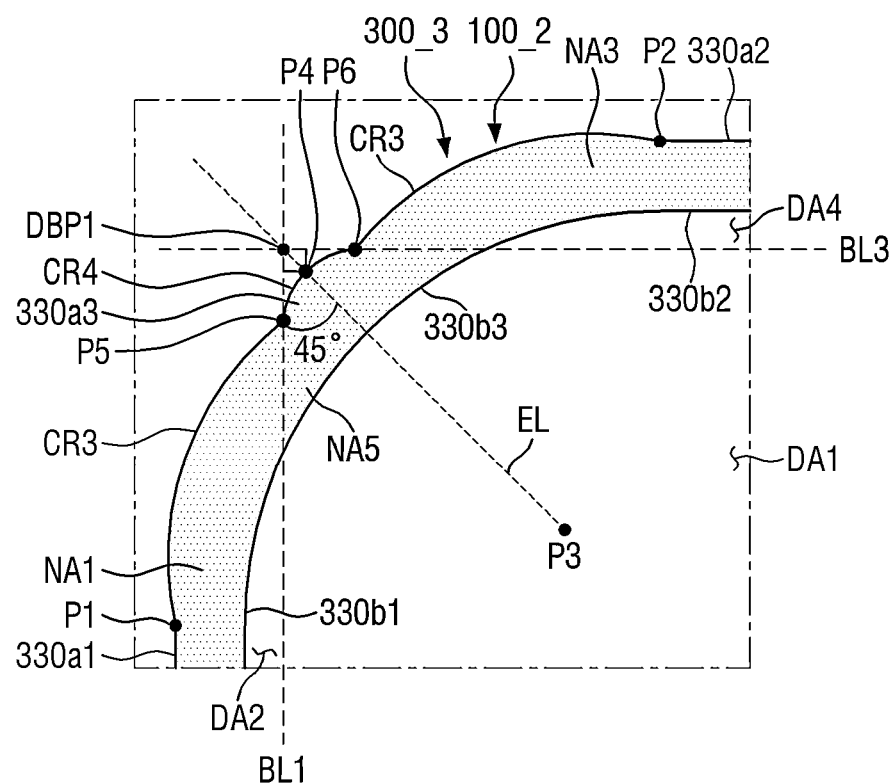
FIG. 12 is an enlarged partial plan view of a display panel and a window according to yet another embodiment.

FIG. 12 is an enlarged partial plan view of a display panel and a window according to yet another embodiment.

Referring to FIG. 12, a display panel 100_2 according to the present embodiment is different from the display panel 100 of FIG. 7 in that a plurality of inflection points are included between the first point P1 and the fourth point P4 and between the second point P1 and the fourth point P4. The plurality of inflection points may be disposed on an outer profile of the display panel 100_2.

More specifically, the display panel 100_2 according to the present embodiment may include a plurality of inflection points P5 and P6 between the first point P1 and the fourth point P4 and between the second point P2 and the fourth point P4.

As in an embodiment, the upper left corner portion of the display panel 100_2 may be symmetrical with respect to the extension line EL. With respect to the extension line EL, the first-fifth portion of the first non-display region NA1 may be symmetrical with the second-fifth portion of the third non-display region NA3, and the third-first portion of the fifth non-display region NA5 on one side of the extension line EL and on the other side of the extension line EL may be symmetrical.

In the present embodiment, it is shown that there are two of the plurality of inflection points P5 and P6, but the present inventive concept is not limited thereto, and there may be an even number of four or more, such as four or six, of the plurality of inflection points. Hereinafter, a description will focus on the fact that there are two of the plurality of inflection points.

For example, the plurality of inflection points P5 and P6 may be disposed on the outer profiles of the first non-display region NA1 and the third non-display region NA3, respectively. However, the present inventive concept is not limited thereto, and the plurality of inflection points P5 and P6 may be disposed on the outer profile of the fifth non-display region NA5.

Even in the present embodiment, along the outer profiles of the non-display regions NA1, NA3, and NA5 of the upper left corner portion of the display panel 100_2, a length from the first point P1 to the fourth point P4 may be the same as a length from the second point P2 to the fourth point P4.

In addition, when a curved surface shape between the first point P1 and the first inflection point P5 formed along the outer profiles of the non-display regions NA1, NA3, and NA5 of the upper left corner portion of the display panel 100 has a predetermined curvature, and a curved surface shape between the second point P2 and the second inflection point P6 formed along the outer profiles of the non-display regions NA1, NA3, and NA5 of the display panel 100-1 has a predetermined curvature, the curved surface shape between the first point P1 and the first inflection point P5 and the curved surface shape between the second point P2 and the second inflection point P6 may have the same curvature. That is, the curved surface shape between the first point P1 and the first inflection point P5 and the curved surface shape between the second point P2 and the second point P6 may each have a third curvature CR3.

In addition, when a curved surface shape between the fourth point P4 and the first inflection point P5 formed along the outer profiles of the non-display regions NA1, NA3, and NA5 of the upper left corner portion of the display panel 100_2 has a predetermined curvature, and a curved surface shape between the fourth point P4 and the second inflection point P6 formed along the outer profiles of the non-display regions NA1, NA3, and NA5 of the upper left corner portion of the display panel 100_2 has a predetermined curvature, the curved surface shape between the fourth point P4 and the first inflection point P5 and the curved surface shape between the fourth point P4 and the second inflection point P6 may have the same curvature. That is, the curved surface shape between the fourth point P4 and the first inflection point P5 and the curved surface shape between the fourth point P4 and the second inflection point P6 may each have a fourth curvature CR4.

In the present embodiment, the fourth curvature CR4 may be less than the third curvature CR3. That is, the outer profiles of the non-display regions NA1, NA3, and NA5 of the upper left corner portion of the display panel 100_2 may have a center portion having a curvature sharper than that of each portion dispose at the left side and the right side of the center portion.

Unlike the display panel 100 of FIG. 7, in the display panel 100_2 according to the present embodiment, a center point of a circle when the circle is drawn by the curved surface shape between the first point P1 and the first inflection point P5, a center point of a circle when the circle is drawn by the curved surface shape between the second point P2 and the second inflection point P6, and a center point of a circle when the circle is drawn by the curved surface shape between the first inflection point P5 and the second inflection point P6 may be different from each other.

A window base substrate 310_3 may have the same or substantially similar planar shape to the display panel 100_2 as described above and may be disposed to overlap the display panel 100_2 in the thickness direction.

That is, the window base substrate 310_3 may include an outer profile aligned with and/or overlapping the outer profile of the display panel 100_2. The outer profile of the window base substrate 310_3 may be completely aligned with the outer profile of the upper left corner portion of the display panel 100_2.

Even in the present embodiment, as described above, the bending intersection points DBP1 to DBP4 are disposed outside of the display panel 100_2, and thus it is possible to prevent double bending at the corner portions of the display panel 100_2 by the intersecting bending lines BL1 to BL4 when the display panel 100_2 is bent along the bending lines BL1 to BL4. Accordingly, it is possible to prevent an increase in bending stress due to double bending in advance.

In addition, in the display panel 100_2 according to the present embodiment, the corner portion of the display panel 100_2 are symmetrically formed with respect to the extension line EL, and accordingly, when the outer profiles of the non-display regions that are disposed at the corner portion and constitute side surface portions of the display panel 100_2, for example, the first and third non-display regions NA1 and NA3 and the fifth non-display region NA5 constituting a flat portion of the display panel 100, are formed by a cutting process or the like, the outer profiles of the non-display regions may be formed with the same curvature and the same length with respect to the extension line EL, thereby greatly reducing the process time and process error.

Configurations of the upper right corner portion, the lower left corner portion and the lower right corner portion may be substantially the same as the configuration of the upper left corner portion described hereinabove.

Figure 13:
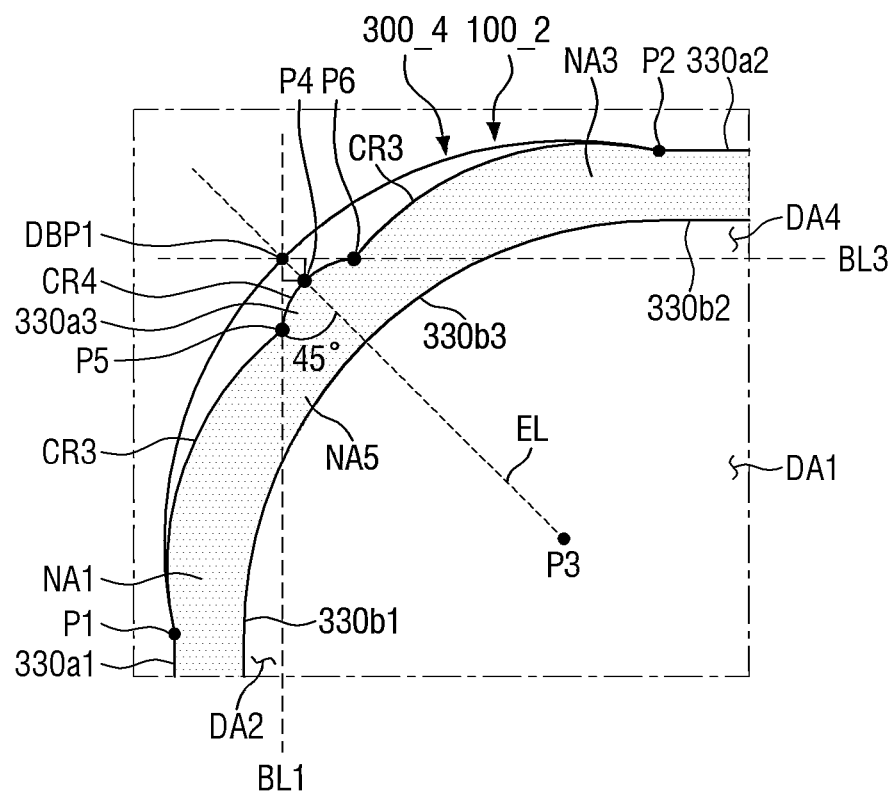
FIG. 13 is an enlarged partial plan view of a display panel and a window according to yet another embodiment.

FIG. 13 is an enlarged partial plan view of a display panel and a window according to yet embodiment.

Referring to FIG. 13, a window 300_4 according to the present embodiment is different from the window 300_4 according to FIG. 12 in that the window 300_4 protrudes more than a corner portion of a display panel 100_2 in a plan view.

More specifically, in the window 300_4 according to the present embodiment, a window base substrate may protrude more than the corner portion of the display panel 100_2 in a plan view. For example, as shown in FIG. 13, the window 300_4 may protrude more than the upper left corner portion of the display panel 100_2 in a plan view.

The window base substrate of the window 300_4 may have a corner portion that passes through the first point P1 and the second point P2 of the display panel 100_2 in a plan view and extends outward more than the first and second inflection points P5 and P6. A curvature of the upper left corner portion of the window base substrate of the window 300_4 may be greater than a curvature of the upper left corner portion of the display panel 100_2.

The number of curvatures of the corner portion of the window base substrate of the window 300_4 may be one, but the present inventive concept is not limited thereto, and a plurality of curvatures may be included. Even in this case, the curvature of the corner portion may be greater than the curvature of the corner portion of the display panel 100_2.

Even in the present embodiment, as described above, the bending intersection points DBP1 to DBP4 are disposed outside of the display panel 100_2, and thus it is possible to prevent double bending at the corner portions of the display panel 100_2 when the display panel 100_2 is bent along the bending lines BL1 to BL4. Accordingly, it is possible to prevent an increase in bending stress due to double bending in advance.

In addition, in the display panel 100_2 according to the present embodiment, the upper left corner portion of the display panel 100_2 are symmetrically formed with respect to the extension line EL, and accordingly, when the outer profiles of the non-display regions that are disposed at the upper left corner portion and constitute side surface portions of the display panel 100_2, for example, the first and third non-display regions NA1 and NA3 and the fifth non-display region NA5 constituting a flat portion of the display panel 100, are formed by a cutting process or the like, the outer profiles of the non-display regions may be formed with the same curvature and the same length with respect to the extension line EL, thereby greatly reducing the process time and process error.

Configurations of the upper right corner portion, the lower left corner portion and the lower right corner portion may be substantially the same as the configuration of the upper left corner portion described hereinabove.

The invention claimed is:

1. A display device comprising:
   a display panel having a display region and a non-display region surrounding the display region, the display panel including at least one corner portion; and
   a cover window disposed on the display panel,
   wherein the display panel is bent along a first bending line extending in a first direction and a second bending line extending in a second direction crossing the first direction,
   wherein the display region includes a first display region disposed in a center portion of the display region, a second display region disposed adjacent to a first side of the first display region, and a third display region disposed adjacent to a second side of the first display region that is disposed adjacent to the first side,
   wherein the non-display region includes a first non-display region disposed adjacent to the second display region, a second non-display region disposed adjacent to the third display region, and a third non-display region disposed between the first non-display region and the second non-display region,
   wherein an outer profile of a part of the first non-display region, an outer profile of a part of the second non-display region, and an outer profile of the third non-display region form the at least one corner portion of the display panel, and
   wherein the at least one corner portion is symmetrical with respect to an extension line that bisects an angle formed by the first bending line and the second bending line.

2. The display device of claim 1, wherein a first intersection point between the first bending line and the second bending line is disposed outside of the at least one corner portion of the display panel.

3. The display device of claim 2, wherein the outer profile of the first non-display region includes a first-first portion having a linear shape and a first-second portion having a curved surface shape, the outer profile of the second non-display region includes a second-first portion having a linear shape and a second-second portion having a curved surface shape, and the outer profile of the third non-display region includes a third-first portion having a curved surface shape.

4. The display device of claim 3, wherein the first-second portion, the second-second portion, and the third-first portion form the at least one corner portion.

5. The display device of claim 4, wherein a part of the third-first portion and the first-second portion form a first sub-corner portion, and another part of the third-first portion and the second-second portion form a second sub-corner portion, and the first sub-corner portion and the second sub-corner portion are symmetrical to each other with respect to the extension line.

6. The display device of claim 5, wherein the first non-display region include a first point where the first-first portion and the first-second portion meet each other, the second non-display region include a second point where the second-first portion and the second-second portion meet each other, the third non-display region include a third point through which the extension line intersect the outer profile of the third non-display region, and a length from the first point along the at least one corner portion to the third point is the same as a length from the second point to the third point.

7. The display device of claim 5, wherein the first sub-corner portion and the second sub-corner portion each have a uniform curvature and a curvature of the first sub-corner portion and a curvature of the second sub-corner portion are the same as each other.

8. The display device of claim 7, wherein centers of circles of the first sub-corner portion and the second sub-corner portion are the same as each other.

9. The display device of claim 7, wherein centers of circles of the first sub-corner portion and the second sub-corner portion are different from each other.

10. The display device of claim 5, wherein the first sub-corner portion and the second sub-corner portion have a plurality of curvatures.

11. The display device of claim 1, wherein the cover window includes a window base substrate having a size equal to or larger than a size of the display panel in a plan view, and a printed layer overlapping the first to third non-display regions of the display panel of the window base substrate in a thickness direction.

12. The display device of claim 11, wherein the display panel includes a flat portion, a first side surface portion bent in a thickness direction from a first side of the flat portion with respect to the first bending line, and a second side surface portion bent in the thickness direction from a second side of the flat portion with respect to the second bending line, and
wherein the flat portion includes the first display region and the third non-display region, the first side surface portion includes the first non-display region and the second display region disposed between the first non-display region and the first display region, and the second side surface portion includes the second non-display region and the third display region disposed between the second non-display region and the first display region.

13. The display device of claim 12, wherein the cover window has a size larger than a size of the display panel in a plan view and covers the side surface portions of the display panel.

14. A display panel comprising:
at least one corner portion; and
a display region and a non-display region surrounding the display region,
wherein the display panel is bent along a first bending line extending in a first direction and a second bending line extending in a second direction crossing the first direction,
wherein the display region includes a first display region disposed in a center portion of the display region, a second display region disposed adjacent to a first side of the first display region, and a third display region disposed adjacent to a second side of the first display region that is disposed adjacent to the first side,
wherein the non-display region includes a first non-display region disposed adjacent to the second display region, a second non-display region disposed adjacent to the third display region, and a third non-display region disposed between the first non-display region and the second non-display region,
wherein an outer profile of a part of the first non-display region, an outer profile of a part of the second non-display region, and an outer profile of the third non-display region form the at least one corner portion of the display panel, and
wherein the at least one corner portion is symmetrical with respect to an extension line that bisects an angle formed by the first bending line and the second bending line.

15. The display panel of claim 14, wherein a first intersection point between the first bending line and the second bending line is disposed outside of the at least one corner portion of the display panel.

16. The display panel of claim 15, wherein the outer profile of the first non-display region includes a first-first portion having a linear shape and a first-second portion having a curved surface shape, the outer profile of the second non-display region includes a second-first portion having a linear shape and a second-second portion having a curved surface shape, and the outer profile of the third non-display region includes a third-first portion having a curved surface shape, and
wherein the first-second portion, the second-second portion, and the third-first portion form the at least one corner portion.

17. The display panel of claim 16, wherein a part of the third-first portion and the first-second portion form a first sub-corner portion, and another part of the third-first portion and the second-second portion form a second sub-corner portion, and the first sub-corner portion and the second sub-corner portion are symmetrical to each other with respect to the extension line.

18. The display panel of claim 17, wherein the first sub-corner portion and the second sub-corner portion each have a uniform curvature and a curvature of the first sub-corner and a curvature of the second sub-corner are the same as each other.

19. The display panel of claim 18, wherein centers of circles of the first sub-corner portion and the second sub-corner portion are the same as each other.

20. The display panel of claim 18, wherein centers of circles of the first sub-corner portion and the second sub-corner portion are different from each other.

* * * * *